United States Patent [19]

Cabot et al.

[11] Patent Number: 5,265,201
[45] Date of Patent: Nov. 23, 1993

[54] MASTER-SLAVE PROCESSOR HUMAN INTERFACE SYSTEM

[75] Inventors: Richard C. Cabot, Portland; Robert G. Wright, Hillsboro; Carl A. Hovey, Beaverton, all of Oreg.

[73] Assignee: Audio Precision, Inc., Beaverton, Oreg.

[21] Appl. No.: 934,882

[22] Filed: Aug. 24, 1992

Related U.S. Application Data

[63] Continuation of Ser. No. 430,581, Nov. 1, 1989, abandoned.

[51] Int. Cl.[5] ............................................. G06F 15/62
[52] U.S. Cl. ................................... 395/163; 395/162; 364/132
[58] Field of Search ............................... 364/518–522, 364/200, 900, 132; 340/722; 395/162–163; 371/20

[56] References Cited

U.S. PATENT DOCUMENTS

| | | | |
|---|---|---|---|
| 4,417,336 | 11/1983 | Weilbacker | 371/20 |
| 4,467,412 | 8/1984 | Hoff | 364/200 M |
| 4,471,398 | 9/1984 | London et al. | 340/722 |
| 4,495,594 | 1/1985 | Eggebrecht et al. | 364/521 X |
| 4,684,990 | 8/1987 | Oxley | 364/522 X |
| 4,763,280 | 8/1988 | Robinson et al. | 364/518 |
| 4,907,146 | 3/1990 | Caporali | 364/132 |
| 4,916,301 | 4/1990 | Mansfield et al. | 395/163 X |

Primary Examiner—Gary V. Harkcom
Assistant Examiner—Almis Jankus
Attorney, Agent, or Firm—William A. Birdwell & Associates

[57] ABSTRACT

A master-slave processor human interface system. An electronic device, a slave processor for controlling the electronic device and performing certain computational functions, a master processor for controlling the slave processor, an input device and an output device associated with the master processor, and an information storage device are provided. Individual slave processor programs are selected, retrieved from the information storage device, and loaded into the slave processor for implementing corresponding functions of the slave processor and electronic device, while a single master processor program which adapts itself to the selected slave processor program accepts input data and operational selections and displays output information according to a predetermined spatial arrangement for each such function, thereby providing the human interface.

34 Claims, 4 Drawing Sheets

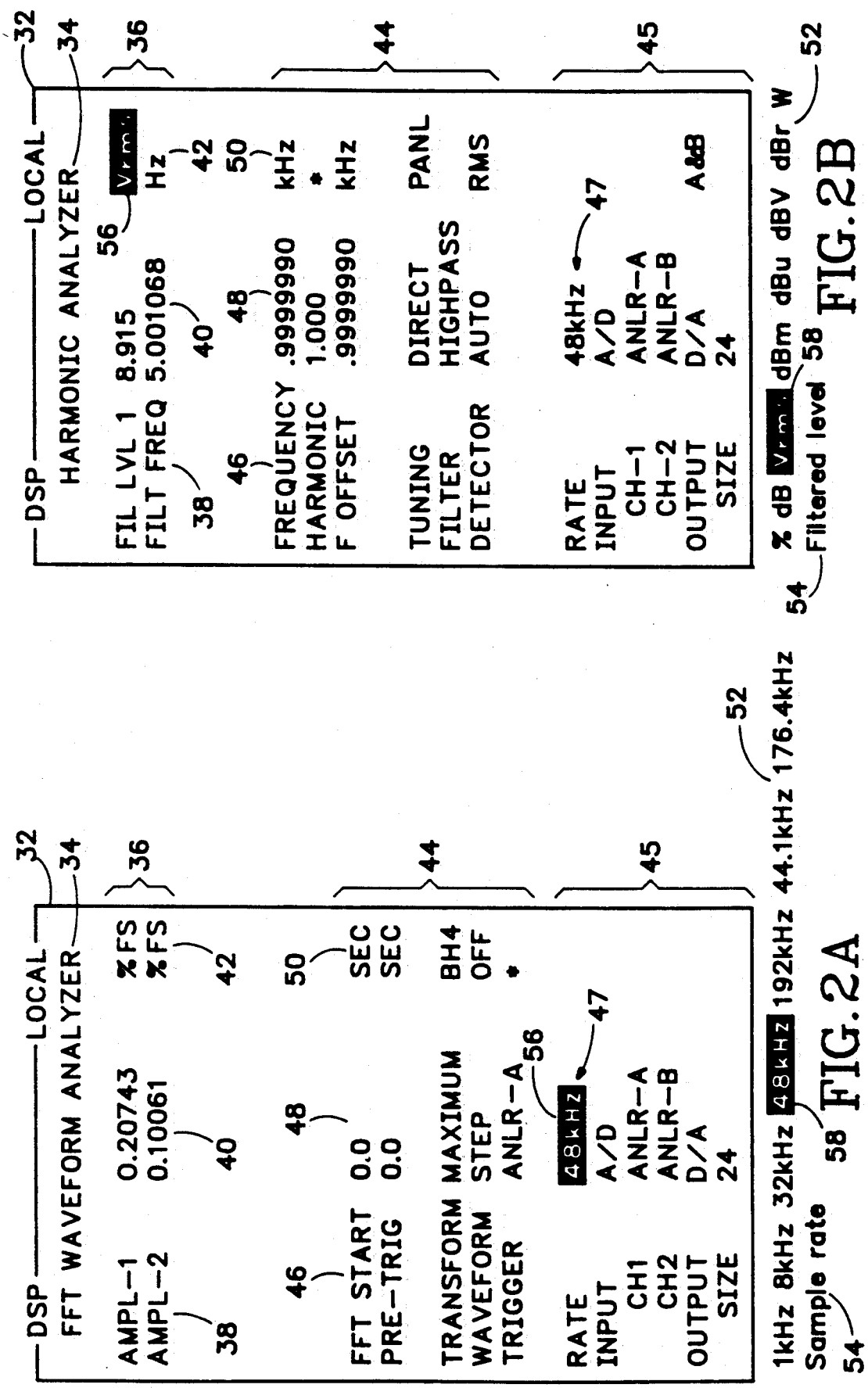

MASTER-SLAVE PROCESSOR HUMAN INTERFACE SYSTEM

This is a continuation of copending application Ser. No. 07/430,581 filed on Nov. 1, 1989 now abandoned.

BACKGROUND OF THE INVENTION

This invention relates to human interface systems for computer control systems, particularly control systems where a first computer is connected to control an electronic device and the first computer is, itself, controlled by a second computer having an input device and a visual output device for communicating with a human operator.

In modern electronic test instruments it is common to employ a digital computer to control the operations of a test instrument and to receive, evaluate, and display the results of data obtained by the test instrument. The computer is typically a microprocessor which is dedicated by firmware to cause the test instrument to perform specific test functions or software programmable to perform any of a variety of test functions. Sometimes that instrument may be controlled by a special purpose computational circuit. The instrument may also be controlled by a general purpose digital computer electrically-interfaced with the test circuitry of the instrument, or with a control computer within the instrument to perform certain functions and to receive, evaluate, and display the results. Such computers, microprocessors, and special purpose computational circuits will be referred to herein generally as "processors."

Where the instrument contains a first processor for controlling the instrument and a second processor controls the first processor, the first processor will be referred to as a "slave" processor and the second processor will be referred to as a "master" processor. In a master-slave system, there is ordinarily a respective random access memory associated with each processor, and at least one mass information storage device, such as a magnetic disk, associated with the system. The system also typically includes an input device, such as a keyboard associated with the master processor, and a visual output device such as a cathode ray tube ("CRT") display or a printer, associated with the master processor.

In programmable computer controlled test instruments it is often desirable to change the control computer program in order to perform different test, data evaluation, or output functions. The software typically comprises several functionally distinct parts, such as parts which perform the human interface, circuit control, file storage, and computational functions. Sometimes these parts are divided between different programs. In particular, in a master-slave system, the computational function is ordinarily performed by a program in the slave processor, while the human interface function is ordinarily performed by a program in the master processor. In order that one program "understand" the operation of the other and that the human interface function of the master processor program accurately represents the computational functions performed by the slave processor program, it has heretofore been necessary to change both programs simultaneously.

There are a number of disadvantages associated with the necessity of simultaneously changing the master and slave processor programs in a master-slave system. First, the total program code for both programs is normally very large, which requires a long time to load from the storage device to the processor memory and also requires a large amount of storage space for all of the various test function programs. Second, passing information from an existing program to a new one is difficult. Third, additional master processor programs, at least the human interface part of the master processor program, must be written and maintained for each slave processor program, even though the differences in the human interface part may be small. Since the amount of code required for the human interface part of the master program typically far exceeds the amount of code required for the slave program, for example, where the master program requires 300,000 bytes of code and the slave program only requires 1,000 bytes of code, this requires an excessive amount of storage space for multiple master programs to perform very similar functions. Fourth, the use of many distinct programs makes the system more complicated to use, and less "user friendly."

Thence, it can be seen that there is a need for a master-slave processor human interface system that reduces program storage requirements, overhead, and changeover time, and system complexity.

SUMMARY OF THE INVENTION

The present invention solves the aforementioned problems and meets the aforementioned needs by providing a master-slave processor human interface system that is capable of maintaining only one human interface program which can adapt itself to different slave processor programs. In this system, a new slave processor program, or at least the computational parts, are loaded into the slave processor for for each new task that the electronic device controlled by the slave processor is to perform, without also loading a new master program, thereby greatly reducing program storage requirements, program overhead, changeover time, and system complexity.

A typical system according to the invention comprises an electronic device controlled by a slave processor; a slave processor and associated random access memory; a master processor and associated random access memory, input device and visual display device; and an information storage device, though other equipment configurations might also be used. The slave processor, which may perform computational as well as control functions, and the electronic device would typically comprise a single test instrument, such as a digital audio analyzer.

Ordinarily, one master program, containing the human interface function, and a plurality of slave programs, each containing computational functions corresponding to respective modes of operation of the slave processor and electronic device under control of the slave processor, would be saved in the storage device. A set of display components, respective display location codes, default instructions, and display format instructions is saved in the storage device for each slave processor program, ordinarily as a part thereof. A display component is an item of information, such as a label, setting, data value, or other symbol to be displayed in a spatial location identified by the corresponding location code. The spatial locations where the display components may be displayed on a display device, e.g., a video monitor, are determined by the master processor program, which includes display component spatial location assignments by location code.

The master program is loaded into the master processor random access memory and thereby enables the master processor to communicate with the human operator by monitoring the input device and sending properly formatted information to the display device. At the command of the operator, the master program selects a slave program, looks up the display components associated with the slave program and displays them. It then loads default mode and setting instructions into the slave processor memory, followed by the slave processor program itself.

Once the slave processor program is loaded into the slave processor memory, the master program monitors the input device for operator selections of modes and settings, as well as a help message request. The master processor program thereafter sends mode selections and function and numerical settings to the slave processor, displays those selections and settings, where appropriate, and displays data generated by the electronic device and slave processor.

Therefore, it is a principal objective of the present invention to provide a new and improved human interface system for a computer control system having master and slave processors.

It is another objective of the present invention to provide such a human interface system wherein a single master processor program for providing a human interface may be used with a plurality of slave processor programs which perform different functions such that they have different interface information requirements.

It is a further objective of the present invention to provide such a human interface system wherein one of a plurality of slave processor programs is loaded into the slave processor memory depending on the functions that the device and the slave processor are to perform, without changing the master processor program.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2A is an illustration of one exemplary display for a "FFT (Fast Fourier Transform) Waveform Analyzer" function in a digital audio analyzer system according to the present invention.

FIG. 2B is an illustration of another exemplary display of a "Harmonic Analyzer" function of a digital audio analyzer system.

DESCRIPTION OF THE PREFERRED EMBODIMENT

Figure 1:
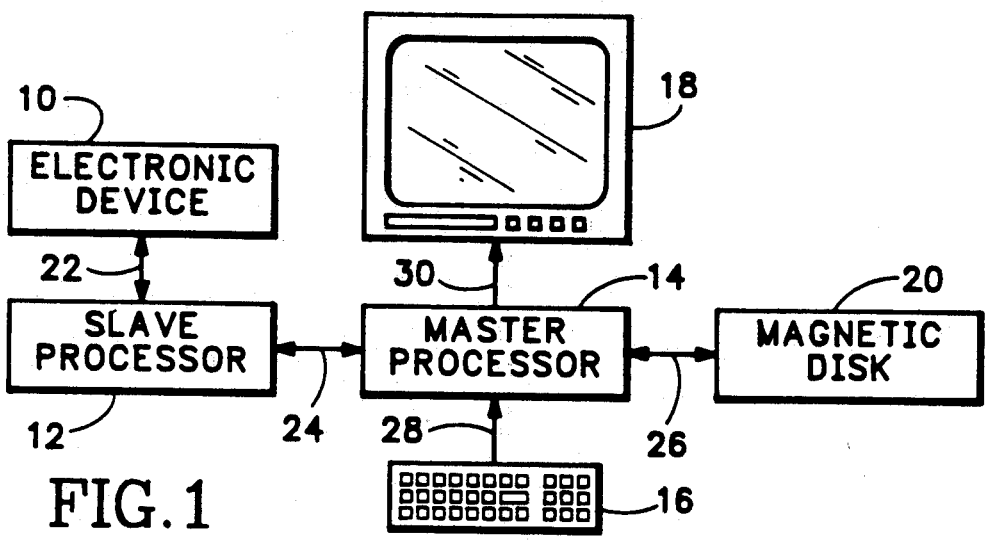
FIG. 1 is a block diagram of a master-slave processor human interface system according to the present invention.

As shown in FIG. 1, the preferred embodiment of a master-slave processor human interface system basically comprises an electronic device 10 to be controlled by a digital computer system, a slave processor 12 for controlling the electronic device, and a master processor 14 for controlling the slave processor. The master processor 14 has connected to it a keyboard 16 as an input means, a video monitor 18 as a visual output means, and a magnetic disk 20 as a mass information storage means.

The slave processor 12 transmits control signals and data to the electronic device 10 and receives information and data from the electronic device via communication channel 22. The master processor 14 and slave processor 12 transmit and receive data and information via communication channel 24. The master processor transmits instructions and information to the magnetic disk 20 and receives information from the magnetic disk 20 via communication channel 26. The keyboard 16 provides input instructions to the master processor via communication channel 28, and the video monitor 18 receives video output signals from the master processor 14 via communication channel 30.

A master processor program and a plurality of slave processor programs are stored in the magnetic disk 20 for access at the request of the master processor 14. The term "processor program" is used throughout this description to refer to computer programs, as is commonly understood in the art. The master processor 14 and the slave processor 12 each include as parts thereof respective random access memories, as is commonly known in the art. In this description it is assumed that the electronic device 10 is part of a digital audio analyzer which can supply a digital or analog test signal to an audio processing device and examine the output of that audio processing device, another part of the digital audio analyzer being the slave processor 12 itself.

When operation of the system of FIG. 1 is begun, the master processor 14 retrieves the master processor program from the magnetic disk 20. The master processor program is stored in the random access memory of the master processor. The master processor program thereafter receives instructions from the keyboard 16 and provides an output to video monitor 18, thereby acting as the human interface for the system. Various functions to be performed by the electronic device 10 and the slave processor 12 employ corresponding slave processor programs which are selectively retrieved from the magnetic disk 20 by the master processor 14 and loaded into the random access memory of the slave processor 12. The slave processor program loaded in the slave processor random access memory causes the slave processor to provide appropriate control signals and data to the electronic device 10, to receive data back from the electronic device 10, to manipulate that data in accordance with the function to be performed, and to make the resultant data available to the master processor 14 for display thereof.

Representative displays produced on the video monitor 18 are shown in FIGS. 2A and 2B. FIG. 2A shows a display for a "FFT (Fast Fourier Transform) Waveform Analyzer" function, while FIG. 2B shows a display for a "Harmonic Analyzer" function. These are both functions which can be performed by the combination of the slave processor 12 and the electronic device 10 which, for purposes of this description, are assumed to comprise a digital audio analyzer. Each function requires a different slave processor program, but both functions utilize the same master processor program. As will be explained hereafter, the master processor program is indifferent to the function that is being performed by the slave processor. Without "understanding" the function to be performed by the slave processor and electronic device, the master processor 14 loads the slave processor program for the selected function into the slave processor random access memory, retaining certain information about the selected function in order to carry out human interface tasks, displays in accordance with a predetermined format information provided to it related to the selected function, and ensures that appropriate input information is transmitted to the slave processor.

In FIG. 2A there are fixed display components and there are variable display components. The fixed display components comprise the box 32, and certain symbols associated with the box, that is, in this exemplary case: "DSP", "LOCAL" and those symbols designated by the bracket 45, except for the display component 47. It is to be appreciated, however, that these fixed components are specific only to the illustrative application and that other arrangements of fixed components may be used without departing from the principles of the invention.

The rest of the display comprises variable components as follows: There is a title component 34. There are one or more lines of output components 36 (e.g., data generated by the electronic device 10 and slave processor 12), each line comprising a label 38, a numeric value 40, and a units symbol 42. There are also one or more lines of setting components 44, each line comprising a setting label 46, a setting 48, and a units or status symbol 50. In addition, below the box 32 there is an alternative settings component 52, comprising one or more alternative settings for the items within the box highlighted by the principal cursor 56, identified as a rectangle of dark background within the box 32. Finally, there is a comment component 54 which, where appropriate, provides a comment that is a spelled out description of the labels abbreviated within the box 32 when highlighted by the principal cursor 56. FIG. 2B shows a similar display for a "Harmonic Analyzer" function.

When the principal cursor 56 is moved to a particular component for which there are alternative settings or a comment, the alternatives are displayed as the alternative settings component 52 and the comment is displayed as the comment component 54, as shown in FIGS. 2A and 2B. A subsidiary cursor 58 is positioned on the current alternative selection, as shown by the rectangle of dark background in the alternative settings component below the respective boxes 32 of FIGS. 2A and 2B.

The master processor program provides for movement of the principal cursor 56 up and down, and back and forth, within the box 52, and movement of the subsidiary cursor 58 back and forth among the alternative settings without moving the principal cursor 56, in a manner that is commonly known to the programming art. When the subsidiary cursor is placed on a particular setting, that setting appears in the spot where the principal cursor is located within the box 32. Where a numeric setting is required to establish the setting, rather than a selection from among alternatives, the principal cursor is moved to the component of the numeric setting location, the numeric value is typed on the keyboard by the operator, and it is displayed at the location of the principal cursor. Each setting is also transmitted by the master processor program to the slave processor, and data obtained by the slave processor program from the electronic device 10 is manipulated, as appropriate, made available to the master processor, and displayed by the master processor program at the appropriate location for that output component.

Figure 2C:
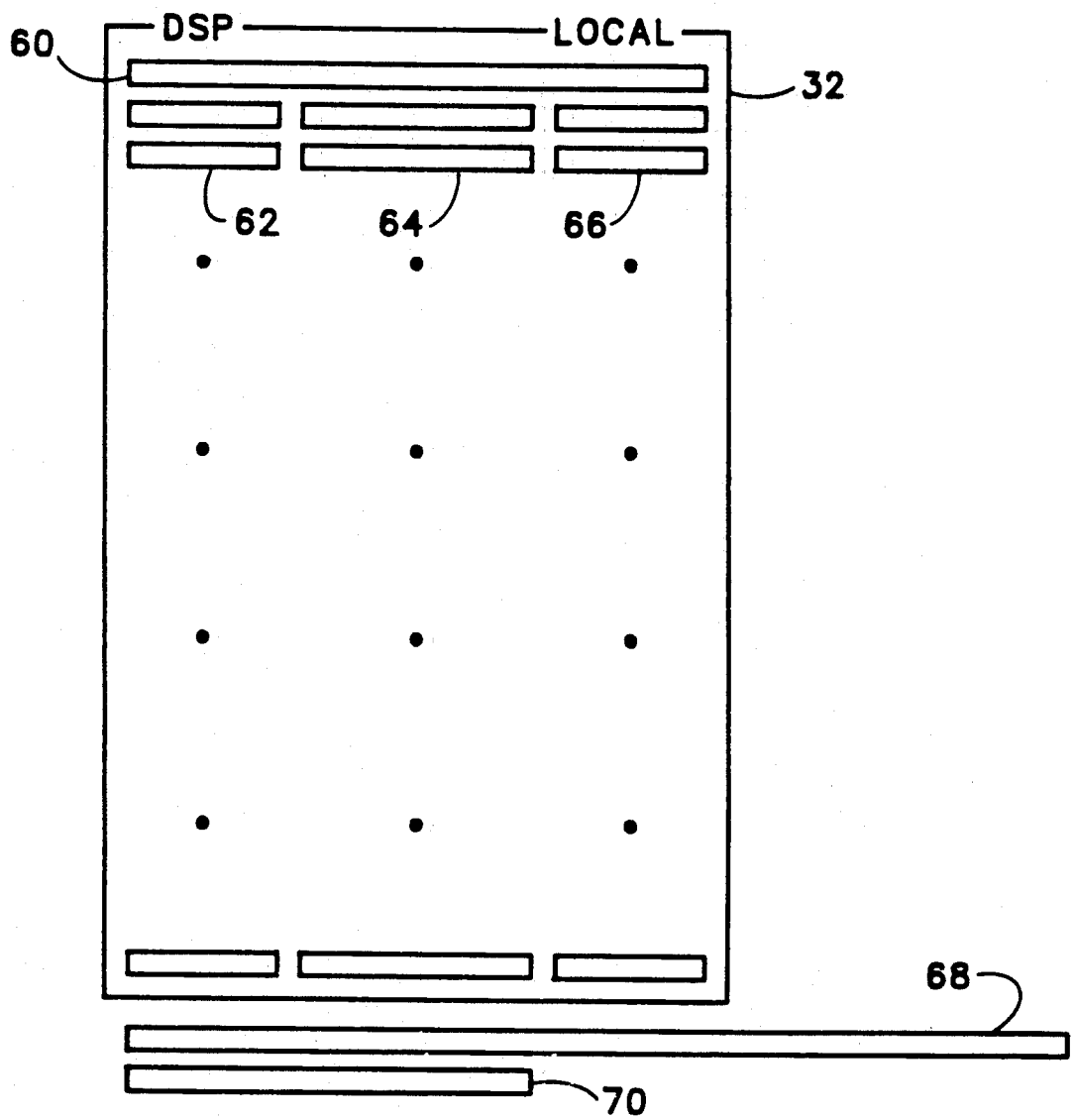
FIG. 2C is an illustration of the format of a visual display according to the present invention.

The format of an exemplary display, together with display regions representing the spatial locations of display components, is shown in FIG. 2C. Region 60 represents the location of a title. Regions 62, 64, and 66 represent locations for labels, numeric values or settings, and units or status symbols, respectively. It is to be recognized that multiple component regions 62, 64, and 66 exist along the vertical dimension of box 32 as indicated by the dots within that box. An alternative settings component region 68 and a comment component region 70 are disposed below the box 32.

The master processor program establishes the display format and the spatial locations of display components. It need not, and preferably does not, understand the significance of the display components. Rather, the display regions are identified by corresonding codes. The display components for a given slave processor program and corresponding location codes identifying the spatial locations where they are to be displayed are stored as part of, or in association with, the slave processor program, and the master processor program accesses those components and displays them solely on the basis of their location codes.

Where data obtained and generated by the slave processor 12 is to be displayed, it is accessed from the random access memory of the slave 12 processor by the master processor 14 based upon a location code which identifies the display location of the data in the random access memory so that the master processor program need not understand the nature of the data. When a selection is made, or data is to be accepted by the system through the keyboard 16, the location of the principal cursor identifies the display component associated with that location for the current slave processor program, which enables the master processor program to display the input information and send it to the random access memory of the slave processor to be stored in a memory location determined by the appropriate location code, without understanding the meaning of the input data. While, in the exemplary embodiment of the invention, the content of display components which represent output data is stored in a memory location of the random access memory of the slave processor so that it may be accessed by either the master processor or the slave processor, this is a matter of convenience. Other data storage arrangements might also be used in an implementation of the invention.

For each slave processor program, there is a look up table of display components. An example of such a look up table is shown by the following display Display Component Chart.

Display Component Chart

```
00 COBJ 'UNITS, DIRECT, HARMONIC, OFFSET, 64/sec, HIGH PASS, CH1, CH2, BP-WIDE, BP-NARROW,PANL,U194,U196
01 COBJ 'TITLE, HARMONIC ANALYZER'
02 COBJ 'REA00,FIL LVL 1, Filtered level, 1.414213562, 12, 7, 39, 76, 40, 42, 43, 41, 77, 220, 219, 0'
03 COBJ 'REA01,FILT FREQ, filter frequency, 1.0 1, 56, 0'
04 COBJ 'REA02, , , 1.0, 0, 254'
05 COBJ 'REA03, , , 1.0, 0, 254'
06 COBJ 'SET0, FREQUENCY,Bandpass filter frequency DIRECT mode, 1.0, 1, 0.00083333, 0.907029, 56'
07 COBJ 'SET1,HARMONIC,Bandpass filter HARMONIC multiplier, 9.00001, 0, 0.1111111, 1.0, 8'
08 COBJ 'SET2,F OFFSET,Bandpass filter frequency OFFSET, 1.0, 1, −0.907029, 0.907029, 56'
09 COBJ 'SET3, , ,1.0, 0, 0.0, 1.0, 254'
10 COBJ 'SET4,TUNING,Bandpass tuning mode, 244, 245, 246'
11 COBJ 'SET5,Bandpass filter tuning source, 186, 62, 53'
12 COBJ 'SET6,FILTER,Filter type selection, 248, 251, 252'
13 COBJ 'SET7, ,254'
14 COBJ 'SET8,DETECTOR,Reading rate, 83, 21, 29, 13, 20, 247'
15 COBJ 'SET9,Detector response, 70'
16 COBJ 'RATES, SAMPLE RATES, 23,24,27,28,34
```

The Display Component Chart is an exemplary look up table of display components, and other information, stored as part of a slave processor program for the aforementioned Harmonic Analyzer function of a digital audio analyzer system. The components are stored as comments in the object file of the slave processor program, the slave processor program being written in assembly language for a Motorola DSP 56001 Digital Signal Processor Device, available from Motorola Corporation. In that language the expression "COBJ" means that the material in single quotes following that expression is a comment, rather than an executable instruction; but it is a comment that is compiled and loaded into memory along with the rest of the program. Of course, types of processors, other programming languages, and other means of building a table, may be employed without departing from the principles of this invention.

In the Chart, line 00 is a set of alternative display components arranged in an order corresponding to respective numeric codes. Those codes are employed selectively in other parts of the table. The first symbol following COBJ, i.e., "UNITS", in that line identifies the information that follows as a set of alternative display components used by the slave processor program. This set of alternative components is loaded into the master processor random access memory for use by the master processor program.

Line 01 comprises the title display component, appropriately identified by the location code "TITLE" following COBJ. Thence, when the master processor program accesses the slave processor program from the magnetic disk 20, it identifies the title component "HARMONIC ANALYZER" by the code "TITLE" and places that component into the title region 60 of the display.

Line 02 in the table comprises the display components for the first line of output display components within the box 32 of the display, along with related information to be used by the master processor program. The display components and related information are arranged in that line in accordance with a predetermined format known to the master processor program. The first symbol following COBJ, that is, "READ0," is the code by which the following set of display components and related information is identified as belonging to a particular set of output regions. The second symbol, "FIL LV 1" is the label to be placed in display region 62. The third symbol, "Filtered level," is the comment component which would be placed in region 70 if the principal cursor 56 is placed on the display region showing the display component "FIL LV 1.". The fourth symbol, "1.414213562," is a number which comprises a scale factor for data to be displayed, and the fifth symbol, "12," is a type number that identifies how the scale factor is to be used. In the preferred embodiment one of several modes of scaling may be selected, e.g., "scale only by the scale factor," "divide the displayed data by the sample rate value," or the like. The master processor program employs the scale factor to properly scale the data displayed in region 64 without knowing the meaning of the data. The remaining symbols, which comprise a series of numbers, correspond to the alternative units which may be displayed in region 66. These numbers correspond to units which appear in line 00 or are otherwise stored in the master processor random access memory when the slave processor program and this table are retrieved from the magnetic disk 20.

Lines 03 through 05 represent respective sets of additional output display components extending vertically downward in the display. Thereafter, line 06 comprises the display components for the first line of setting display components, which are arranged in a predetermined format known to the master processor program, and are employed in the same manner as the output lines. Similarly, lines 07 through 25 represent additional setting display components stored in the table according to a predetermined format. It is to be recognized, however, that not all components in a line of the display need be in one line of the table; e.g., lines 12 and 13 of the table contain components that go in regions on the same line of the display. Moreover, variable components may be interspersed on display lines with fixed components, e.g., line 16 of the table identifies the rates which appear in region 47 of the display, yet the symbol "RATE" on that line is a fixed component. While the master processor program does not necessarily understand the meaning of the display components shown in the table, it does understand the organization of the look up table and thereby understands where to place those display components in the display.

As previously indicated, some of the information in the table may be used, but not displayed, by the master processor program. In addition to the scale factor and scale type numbers, maximum and minimum values for data entries may be included in the table. From the table format the master processor program recognizes these numbers as limit values and takes a predetermined action, such as issuing an error message or substituting the limit value for the input value, but otherwise need not understand the significance of such numbers.

Figure 3:
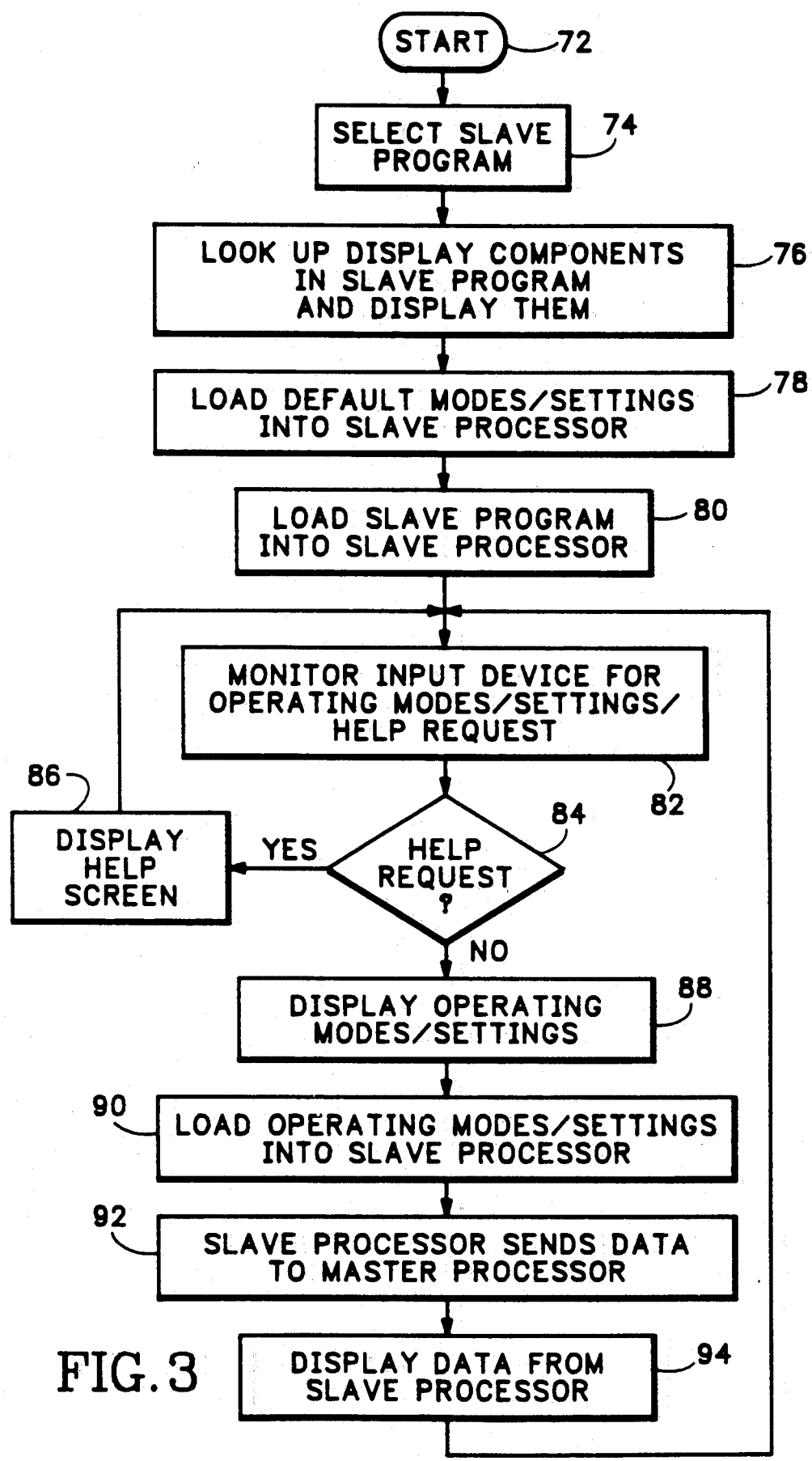
FIG. 3 is a flow chart of a master processor program for a human interface system according to the present invention.

A flow chart of the master processor program is shown in FIG. 3. When the system is started, the master processor program is retrieved from the magnetic disk 20 and loaded into the random access memory of the master processor 14. As shown in that flow chart, after the system is first started at step 72, and upon instruction from the system operator via the keyboard 16, the master processor program in step 74 selects the slave processor program for the particular function to be performed. When the slave processor program is selected, it is retrieved from the magnetic disk 20 along with its display components and default modes and settings. In step 76 it then looks up the display components in the look up table associated with the slave processor program and sends them to the video monitor 18 for display. Default modes and settings for the particular slave processor program are identified and loaded into the random access memory of the slave processor 12 in step 78. Then the selected slave program is itself retrieved from the storage device 20 and loaded into the slave processor 12 in step 80. The system is then ready to perform selected functions.

Figure 4:
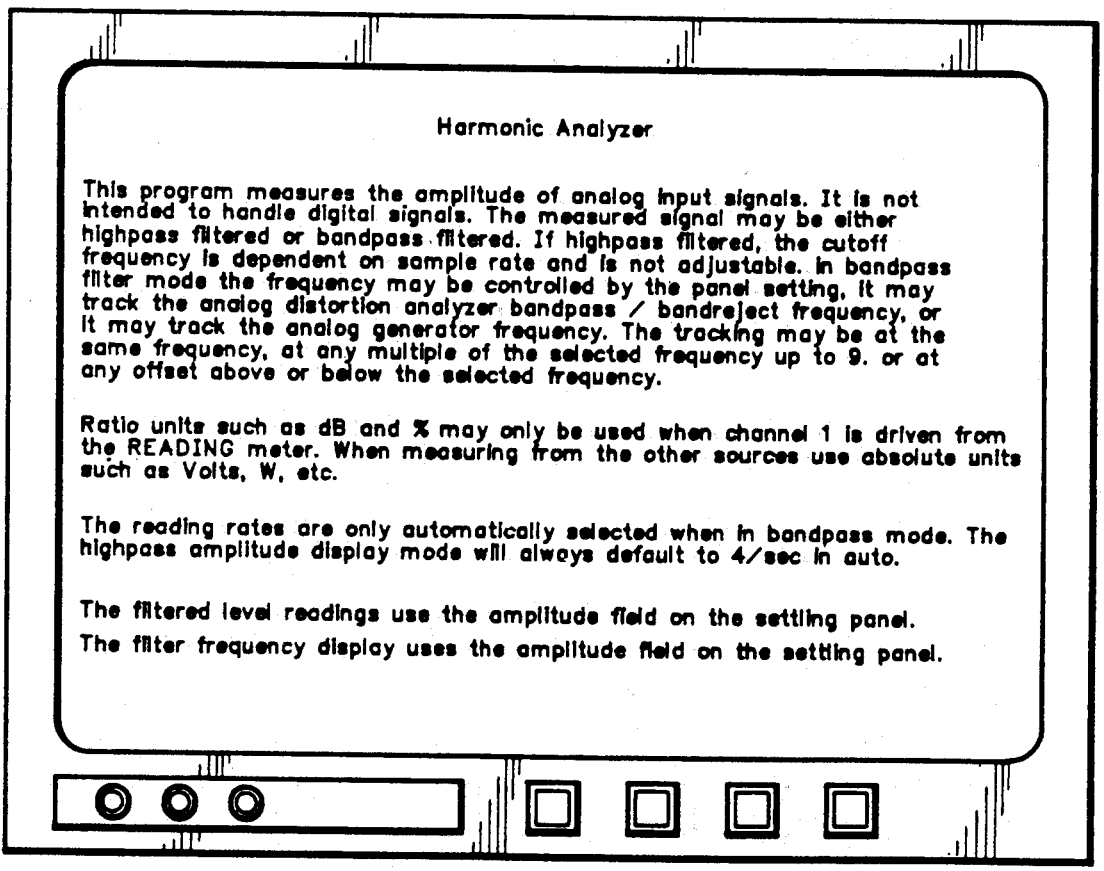
FIG. 4 is an illustration of a display of a help screen for the Harmonic Analyzer function of an exemplary digital audio analyzer system according to the present invention.

In step 82, which occurs repetitively, the master processor program monitors the input device for operator selections of operating modes and settings, or alternatively, for a help request. If the help request is selected at the keyboard 16, as determined at step 84, the master program displays a help screen on the video monitor 18 at step 86. An exemplary help screen is shown in FIG. 4. The help screen text is stored as part of, or in association with, the selected slave processor program, and may be selected to obtain helpful information for running the system.

In the absence of a help request, and upon receiving operating modes or settings, the master processor program displays those modes and settings at step 88. In step 90 the master processor also loads the modes and settings into the slave processor, based upon the location codes associated with the modes and settings. As the electronic device 10 responds to the slave processor 12 and provides data back to the slave processor program, the slave processor processes the data and in step 92 "sends" the processed data to the master processor by storing the data in a random access memory location of the slave processor that can be accessed by the master processor as well as the slave processor, though it could send the data to the master processor directly. The master processor program displays that data in the spatial locations corresponding to its associated location code in step 94. Then, the master processor returns to step 82 to monitor the input device for new operating modes, settings, or help requests.

The following exemplary computer code, which is written in the "C" programming language, shows how the format of the display component look up table may be defined by the master processor program:

```
#include <stdio.h>
char set0_label[9], set0_comment[40];
extern double set0_function();
int set0_units[12];
/****************************************************
* This is the data structure defining an element (field) to be
* displayed on the output screen.
****************************************************/
typedef struct afield {
    char type;              /* may be reading, numset, or mcset field */
    char *lbl;              /* label to be displayed */
    double(*set)();         /* function to set or read value */
    char *comment;          /* appears in help field at bottom of screen */
    int units;              /* used by display and set functions */
    float value;            /* used by display and set functions */
    char *units;            /* pointer to units array */
    char col;               /* column location of field on output screen */
    char row;               /* row location of field on output screen */
    double scale;           /* scale factor to be applied to the setting */
    int scale_type;         /* type of scaling to be used */
}   set0 = {
    1,                      /* this is type 1 (numerical setting) field */
    set0_label,             /* default label is empty, will be loaded */
    set0_function,          /* use this function to set slave */
    set0_comment,           /* default comment is empty, will be loaded */
    0,                      /* unit presently in use for this field */
    0.0,                    /* value presently in use for this field */
    set0_units,             /* pointer to units string array */
    0,                      /* column location of field on output screen */
    0,                      /* row location of field on output screen */
    0.0,                    /* scale factor will be loaded */
    0                       /* scale type will be loaded */
```

The following examplary computer code, also written in C, shows how the information in one setting display component line of the display component look up table may be obtained from the slave program:

```
/****************************************************************
* GET_SET0_RECORD is called when a SET0 COBJ record has been
* located in the binary slave program (called infile here).
* This function reads the rest of the COBJ record and places
* the data into the data structure that will be used to both
* specify the display of SET0 and the function and scaling used
* to pass the setting to the slave processor.
****************************************************************/
get_set0_record()
{
```

```
    int i, cnt;
    get_string( &set0.lbl);            /* read label to be displayed */
    get_string( &set0.comment);        /* read comment to be displayed */
    get_double( &set0.scale);          /* read scale factor to be used */
    get_int( &set0.scale_type);        /* read type of scale factor */
    get_int( &cnt);                    /* read count of units */
    for( i = 0; cnt; i++, cnt--)
        get_int( set0.units[i]);       /* read all units */
}
get_string( char *ptr)
{
    unsigned len;
    fread( &len, sizeof(int), 1, infile);
    fread( ptr, sizeof(char), len, infile);
    *( ptr + len) = '0';  /* terminate string */
}
near get_double( double *num)
{
    fread( num, sizeof(double), 1, infile);
}
near get_int( int *num)
{
    fread( num, sizeof(int), 1, infile);
}
```

The foregoing sections of code are provided merely by way of example as to how a person of ordinary skill in the art might program a processor to implement certain parts of the invention.

It is to be understood that the actual implementation of the procedure described in the flow chart of FIG. 3 may be accomplished in a variety of different ways by a variety of different programming techniques using a variety of different programming languages, subject to the limitations of the slave and master processors, as is commonly understood in the art. Moreover, it is to be understood that such variations in the implementation of the invention may be made without departing from the principles of the invention.

It is also to be understood that one or more of the steps of the flow chart in FIG. 3 may actually be performed by the slave processor 12 rather than the master processor 14, that the magnetic disk 20 may actually be connected to the slave processor 12, rather than the master processor 14, and that other variations in the system hardware could be made without departing from the principles of this invention.

Further, it is to be understood that the display components may be graphical images, "icons," as well as numeric, alphanumeric, and textual symbols.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A system for providing a human interface in an arrangement of a slave processor having an associated memory, a master processor having an associated memory and an associated output means, and a communication channel for transmitting information between the master processor and the slave processor, comprising:
   (a) storage means for storing one or more slave processor programs and one or more sets of interactive information associated with a respective slave processor program for use by the master processor to format information for said output means;
   (b) first retrieving means, coupled to said storage means, for retrieving from said storage means a selected slave processor program and providing it to the slave processor for storage in said memory associated therewith; and
   c) second retrieving means, coupled to said storage means, for retrieving from said storage means a set of display and data handling information associated with said selected slave processor program and providing it to the master processor for storage in said memory associated therewith.

2. The system of claim 1, wherein said storage means comprises an information storage device connected to the master processor.

3. The system of claim 1, wherein said storage means comprises an information storage device connected to the slave processor.

4. A system for providing a human interface in an arrangement of a slave processor having an associated memory, a master processor having an associated memory and an associated output means, and a communication channel for transmitting information between the master processor and the slave processor, comprising:
   (a) storage means for storing one or more slave processor programs and one or more sets of interactive information associated with a respective slave processor program for use by the master processor to format information for said output means, said storage means including means for storing one or more sets of data manipulation information associated with a respective slave processor program for use by the slave processor;
   (b) first retrieving means, coupled to said storage means, for retrieving from said storage means a selected slave processor program and providing it to the slave processor for storage in said memory associated therewith;
   (c) second retrieving means, coupled to said storage means, for retrieving from said storage means a set of interactive information associated with said selected slave processor program and providing it to the master processor for storage in said memory associated therewith; and (d) third retrieving means, coupled to said storage means, for retrieving from said storage means a set of data manipulation information associated with said selected slave processor program and providing it to the slave processor for storage in said memory associated therewith.

5. The system of claim 4, further comprising an electronic test instrument connected to the slave processor for producing said data, the slave processor including means responsive to said selected slave processor program for manipulating said data using said data manipulation information and providing said data, as manipulated, to the master processor.

6. A system for providing a human interface in an arrangement of a slave processor having an associated memory, a master processor having an associated memory and an associated output means, and a communication channel for transmitting information between the master processor and the slave processor, comprising:

(a) storage means for storing one or more slave processor programs and one or more sets of interactive information associated with a respective slave processor program for use by the master processor to format information for said output means;

(b) first retrieving means, coupled to said storage means, for retrieving from said storage means a selected slave processor program and providing it to the slave processor for storage in said memory associated therewith; and (c) second retrieving means, coupled to said storage means, for retrieving from said storage means a set of interactive information associated with said selected slave processor program and providing it to the master processor for storage in said memory associated therewith, the master processor including means for obtaining data from the slave processor and presenting it to said output means in accordance with a format provided by said interactive information associated with said selected slave processor program.

7. The system of claim 6, further comprising an electronic test instrument connected to the slave processor, said data obtained from said slave processor comprising test data produced by the test instrument.

8. The system of claim 7, wherein said master processor further comprises means for scaling said test data in accordance with said interactive information prior to presenting it to said output means.

9. The system of claim 6, wherein said output means comprises a visual display device.

10. A system for providing a human interface in an arrangement of a slave processor having an associated memory, a master processor having an associated memory and an associated output means, and a communication channel for transmitting information between the master processor and the slave processor, comprising:

(a) storage means for storing one or more slave processor programs and one or more sets of interactive information associated with a respective slave processor program for use by the master processor to format information for said output means;

(b) first retrieving means, coupled to said storage means, for retrieving from said storage means a selected slave processor program and providing it to the slave processor for storage in said memory associated therewith; and (c) second retrieving means, coupled to said storage means, for retrieving from said storage means a set of interactive information associated with said selected slave processor program and providing it to the master processor for storage in said memory associated therewith; and (d) an input device connected to the master processor, the master processor including means for receiving input information from said input device and outputting said input information through said output means in accordance with a format provided by said interactive information associated with said selected slave processor program.

11. A system for providing a human interface in an arrangement of a slave processor having an associated memory, a master processor having an associated memory and an associated output means, and a communication channel for transmitting information between the master processor and the slave processor, comprising:

(a) storage means for storing one or more slave processor programs and one or more sets of interactive information associated with a respective slave processor program for use by the master processor to format information for said output means;

(b) first retrieving means, coupled to said storage means, for retrieving from said storage means a selected slave processor program and providing it to the slave processor for storage in said memory associated therewith;

(c) second retrieving means, coupled to said storage means, for retrieving from said storage means a set of interactive information associated with said selected slave processor program and providing it to the master processor for storage in said memory associated therewith; and (d) an input device connected to the master processor, the master processor including means for receiving input information from said input device and providing said input information to said slave processor.

12. The system of claim 11, wherein the master processor further comprises means for outputting said input information through said output means in accordance with a format provided by said interactive information associated with said selected slave processor program.

13. A system for providing a human interface in an arrangement of a slave processor having an associated memory, a master processor having an associated memory and an associated output means, and a communication channel for transmitting information between the master processor and the slave processor, comprising:

(a) storage means for storing one or more slave processor programs and one or more sets of interactive information associated with a respective slave processor program for use by the master processor to format information for said output means;

(b) first retrieving means, coupled to said storage means, for retrieving from said storage means a selected slave processor program and providing it to the slave processor for storage in said memory associated therewith; and (c) second retrieving means, coupled to said storage means, for retrieving from said storage means a set of interactive information associated with said selected slave processor program and providing it to the master processor for storage in said memory associated therewith, said output means comprising a visual display device, and wherein the master processor includes formatting means responsive to said interactive information for causing said visual display device to display selected information in accordance with a format provided by said interactive information associated with said selected slave processor program.

14. The system of claim 13, wherein said interactive information includes fixed display components and selectively variable display components.

15. The system of claim 13, wherein said interactive information includes location codes corresponding to respective display components, and said formatting means further includes means for identifying spatial locations in said format by respective location codes and means for causing said visual display device to display said components in the locations to which their respective location codes correspond.

16. The system of claim 15, wherein said display components may include any of data received from the slave processor, information received from an input device connected to the master precursor, or information included within said interactive information.

17. A system for providing a human interface in an arrangement of a slave processor having an associated memory, a master processor having an associated memory and an associated output means, and a communication channel for transmitting information between the master processor and the slave processor, comprising:
 (a) storage means for storing one or more slave processor programs and one or more sets of interactive information associated with a respective slave processor program for use by the master processor to format information for said output means;
 (b) first retrieving means, coupled to said storage means, for retrieving from said storage means a selected slave processor program and providing it to the slave processor for storage in said memory associated therewith;
 (c) second retrieving means, coupled to said storage means, for retrieving from said storage means a set of interactive information associated with said selected slave processor program and providing it to the master processor for storage in said memory associated therewith; and
 (d) an electronic test instrument connected to the slave processor for supplying a test signal to an electrical device and examining an output of said electrical device, an input device connected to the master processor, and a visual display device connected to the master processor, and said interactive information associated with said selected slave processor program comprises test instrument setting, mode or data identification components, the master processor including means for outputting to said visual display device settings or modes selected through said input device, means for providing said selected settings or modes to the slave processor, and means for outputting to said visual display device data generated by the slave processor in response thereto.

18. A method for providing a human interface in an arrangement of a slave processor having an associate memory, a master processor having an associated memory and an associated output means, and a storage means, comprising the steps of:
 (a) retrieving from said storage means a selected slave processor program and providing it to the slave processor for storage in said memory associated therewith; and
 (b) retrieving from said storage means a set of display and data handling information associated with said selected slave processor program and providing it to the master processor for storage in said memory associated therewith.

19. The method of claim 18, wherein said storage means comprises an information storage device connected to the master processor.

20. The method of claim 18, wherein said storage means comprises an information storage device connected to the slave processor.

21. A method for providing a human interface in an arrangement of a slave processor having an associate memory, a master processor having an associated memory and an associated output means, and a storage means, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith; and
 (c) retrieving from said storage means a set of data manipulation information associated with said selected slave processor program and providing it to the slave processor for storage in said memory associated therewith.

22. The method of claim 21, wherein said arrangement further comprises an electronic test instrument connected to the slave processor for producing said data, said method further comprising the steps of manipulating said data using said data manipulation information and providing said data, as manipulated, to the master processor.

23. A method for providing a human interface in an arrangement of a slave processor having an associated memory, a master processor having an associated memory and an associated output means, and a storage means, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith; and
 (c) obtaining data from the slave processor and presenting it to said output means in accordance with a format provided by said interactive information associated with said selected slave processor program.

24. The method of claim 23, wherein said arrangement further comprises an electronic test instrument connected to the slave processor, said data obtained from said slave processor comprising test data produced by the test instrument.

25. The method of claim 24, further comprising the step of scaling said test data in accordance with said interactive information prior to presenting it to said output means.

26. The method of claim 23, wherein said output means comprises a visual display device.

27. A method for providing a human interface in an arrangement of a slave processor having an associated memory, a master processor having an associated memory and an associated output means, an input device connected to the master processor, and a storage means, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith; and
 (c) receiving input information from said input device and outputting said input information through said output means in accordance with a format provided by said interactive information associated with said selected slave processor program.

28. A method for providing a human interface in an arrangement of a slave processor having an associated memory, a master processor having an associated memory and an associated output means, an input device connected to the master processor, and a storage means, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith; and
 (c) receiving input information from said input device and providing said input to said slave processor.

29. The method of claim 28, further comprising the step of outputting said input information through said output means in accordance with a format provided by said interactive information associated with said selected slave processor program.

30. A method for providing a human interface in an arrangement of a slave processor having an associated memory, a master processor having an associated memory and an associated visual display device, and a storage means, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith; and
 (c) causing said visual display to display selected information in accordance with a format provided by said interface information associated with said selected slave processor program.

31. The method of claim 30, wherein said interactive information includes fixed display components and selectively variable display components.

32. The method of claim 30, wherein said interactive information includes location codes corresponding to respective display components, said method further comprising the step of identifying spatial locations in said format by respective location codes and causing said visual display device to display said components in the locations to which their respective location codes correspond.

33. The method of claim 32, wherein said display components may include any of data received from the slave processor, information received from an input device connected to the master processor, or information included within said interactive information.

34. A method for providing a human interface in an arrangement of a slave processor having an associated memory, a master processor having an associated memory, a storage means, and an electronic test instrument connected to the slave processor for supplying a test signal to an electrical device and examining an output of said electrical device, an input device connected to the master processor, and a visual display device connected to the master processor, comprising the steps of:
 (a) retrieving from said storage means a selected slave processor program and providing it to the slave processor for storage in said memory associated therewith;
 (b) retrieving from said storage means a set of interactive information associated with said selected slave processor program and providing it to the master processor for storage in said memory associated therewith, said interactive information comprising test instrument setting, mode or data identification components; and
 (c) outputting to said visual display device settings or modes selected through said input device, providing said selected settings or modes to the slave processor, and outputting to said visual display device data generated by the slave processor in response thereto.

* * * * *